United States Patent [19]
Mouchot et al.

[11] Patent Number: 6,075,360
[45] Date of Patent: Jun. 13, 2000

[54] MAGNETORESISTIVE COMPONENT HAVING A MULTILAYER STRIP WITH A GEOMETRICAL PATTERN

[75] Inventors: Jean Mouchot, Grenoble; Jean-Marc Fedeli, Beau Croissant; Line Vieux-Rochaz, Sassenage; Marie-Hélène Vaudaine, Seyssins, all of France

[73] Assignee: Commissariat a l'Energie Atomique, Paris, France

[21] Appl. No.: 08/295,991

[22] Filed: Aug. 24, 1994

[30] Foreign Application Priority Data

Sep. 2, 1993 [FR] France ................................. 93 10458

[51] Int. Cl.[7] ............................. G01R 33/09; G11B 5/39; H01L 43/08
[52] U.S. Cl. ........................ 324/251; 338/32 R; 360/113
[58] Field of Search ............................. 324/252, 207.21; 338/32 R; 360/113; 428/332

[56] References Cited

U.S. PATENT DOCUMENTS

| | | | |
|---|---|---|---|
| 4,361,805 | 11/1982 | Narimatsu et al. | 324/252 |
| 4,896,235 | 1/1990 | Takino et al. | 324/252 |
| 5,313,186 | 5/1994 | Schuhl et al. | 324/252 |
| 5,569,544 | 10/1996 | Daughton | 324/252 |
| 5,595,830 | 1/1997 | Daughton | 324/252 |
| 5,637,392 | 6/1997 | Sahakima et al. | 428/332 |

FOREIGN PATENT DOCUMENTS

| | | |
|---|---|---|
| 0 366 396 | 5/1990 | European Pat. Off. . |
| 0 534 791 | 3/1993 | European Pat. Off. . |
| 0 548 841 | 6/1993 | European Pat. Off. . |
| 57-190 381 | 11/1982 | Japan . |
| 01 022 076 | 1/1989 | Japan . |
| 0066479 | 3/1990 | Japan ....................................... 324/252 |

OTHER PUBLICATIONS

Magnetoresistance of Multilayers, IEEE Translation Journal on Magnetics in Japan, H. Yamamoto et al., vol. 7, No. 9, Sep. 1992.

Oscillations in Giant Magnetoresistance and Antiferromagnetic Coupling in $[Ni_{81}Fe_{19}/Cu]_N$ Multilayers, S. S. P. Parkin, Applied Phys. Lett. 60 (4), Jan. 27, 1992.

Giant Magnetoresistance in Ni–Fe/Cu Multilayers formed by Ion Beam Sputtering, Ryoichi Nakatani et al., IEEE Transactions on Magnetics, vol. 28, No. 5, Sep. 1992.

Magnetoresistive Properties and Thermal Stability of Ni–Fe/Ag Multilayers, B. Rodmacq et al., Journal of Magnetism and Magnetic Materials 118 (1993) L11–L16.

*Primary Examiner*—Walter E. Snow
*Attorney, Agent, or Firm*—Pearne, Gordon, McCoy & Granger LLP

[57] ABSTRACT

A magnetoresistive component and transducer for use therewith. The magnetoresistive component has a multilayer-type magnetoresistive strip bent in accordance with a repeated geometrical pattern (7a,7b). The pattern has at least one series of substantially parallel sections (7a,7b) for reducing the demagnetizing fields. The magnetoresistive strip (2) is formed from a stack (13) of magnetic metallic material layers (14) separated by non-magnetic metallic material layers (15). The magnetoresistive component is applicable to a transducer for reading information recorded in magnetic form or for detecting weak magnetic fields.

4 Claims, 6 Drawing Sheets

MAGNETORESISTIVE COMPONENT HAVING A MULTILAYER STRIP WITH A GEOMETRICAL PATTERN

BACKGROUND OF THE INVENTION

The present invention relates to a magnetoresistive component having a repeated geometrical pattern and to a magnetoresistive transducer using said component. This transducer is more particularly intended for producing heads for reading and/or writing informations recorded in magnetic form on a random support such as a hard disk, tape, floppy disk, ticket, card, etc.

This transducer can also be used for detecting and locating weak magnetic fields such as the geomagnetic field and the leaking of weak magnetic fields associated with the presence of cracks in metallic systems.

Magnetoresistive components are generally in the form of a small magnetoresistive bar, whose ends are connected to leads for making a current flow in the bar. In the presence of an external magnetic field, the magnetization M of the resistant bar is differently oriented having the effect of modifying the resistivity of the material. A voltage variation is then observed at the bar terminals and the measurement of this voltage variation represents the value of the external magnetic field. It can also represent its direction.

Thus, by measuring the resistance of the bar, it is possible to measure a magnetic field and conversely measure an electrical resistance by measuring a magnetic field.

The most modern magnetic transducers use magnetoresistive materials deposited in thin film form on a suitable substrate. These films are etched by photolithographic processes in order to give them the shape of a bar.

The magnetic saturation field $H_s$ is defined as being the magnetic field applied to the magnetoresistive component above which the intrinsic electrical resistivity $\rho$ of the component virtually no longer varies. The following ratio is defined:

$$\frac{\Delta\rho}{\rho} = \frac{[\rho(H=0) - \rho(H=Hs)]}{\rho(H=0)}$$

in which H represents the value of the field applied: $\rho(H=0)$ being the resistivity of the magnetoresistive component in zero field and $\rho(H=Hs)$ its resistivity when the component is in the presence of a magnetic field equal to the saturation field. Moreover, $\Delta\rho/\rho=\Delta R/R$, with R representing the resistance of the magnetoresistive component.

The sensitivity $\alpha$ of the magnetoresistive structure and therefore that of a magnetoresistive transducer are defined by the variation of the magnetoresistance $\Delta R/R$ obtained by the application of a unitary magnetic field and it satisfies the relation: $\alpha=(\partial(\Delta R/R)/\partial H)_{H<Hs}$.

The shape of a magnetoresistive component or rather its dimensions influence the orientation of its magnetization. Thus, in the case of a magnetic film, the magnetization tends to be aligned in the plane of the film. Moreover, in the case of a long bar, the magnetization is generally oriented in accordance with said length. This effect amounts to a search for the minimum magnetic energy.

For a given magnetization direction, in the material appears a magnetic field known as the demagnetizing field $H_d$ or form anisotropy field oriented in the direction opposite to that of the magnetization. The intensity of the demagnetizing field is a function of the geometry of the material in question and the direction taken by magnetization within it.

FIG. 1 diagrammatically shows a magnetic bar having an elliptical section, in order to illustrate the components of said demagnetizing field.

The values of the demagnetizing field coefficients are designated $N_X$, $N_Y$ and $N_Z$ respectively in the directions X, Y and Z of an orthonormal coordinate 0XYZ. When the magnetization M is parallel to the direction X, the demagnetizing field proves the relation $H_d=N_X.M$.

For a magnetoresistive bar of elliptical section and assumed to be infinitely long and aligned in the direction X, having a thickness e in the direction Z and a height h in the direction Y, the following relations are proved: $N_X=0$, $N_Y=e/(h+e)$, $N_Z=h/(h+e)$.

In the case of a bar with a rectangular section of thickness e small compared with its height h, which is itself small compared with its length L, a first approximation consists of considering that: $N_X=0$, $N_Y=e/h$, $N_Z=1$.

Thus, an external magnetic field H applied in the direction Y will be reduced within the magnetoresistive component by the demagnetizing field $H_d$ approximately equal in the latter particular case to (e/h).M, whereas said same field applied in direction X will not be reduced.

It should be noted that this approach no longer strictly applies as soon as the component length is comparable with its height or width. Thus, the demagnetizing field is liable to increase the value of the saturation field Hs and therefore reduce the sensitivity of the transducer.

Hitherto the magnetoresistive materials used for producing magnetic transducers were ferromagnetic-type monolithic materials mainly consisting of compounds based on iron and nickel ($Fe_{19}Ni_{81}$, $Fe_{20}Ni_{80}$) and those based on iron, nickel and cobalt ($Fe_{15}Ni_{65}Co_{20}$, $Fe_5Ni_{80}Co_{15}$, ...).

At present, new magnetoresistive materials are available. These are metallic multilayer magnetic structures (MMMS) constituted by a stack of magnetic layers separated by non-magnetic metallic layers having a thickness such that there is an antiferromagnetic coupling between the magnetic layers.

The investigated metallic multilayer magnetic structures are of different types. They are constituted by metals chosen from among cobalt, iron, nickel, alloys of iron and nickel, copper, chromium, silver, gold, molybdenum, ruthenium and magnesium, as described in document (1) by H. Yamamoto and T. Shinjo (IEEE Translation Journal on Magnetics in Japan, vol. 7, No. 9, September 1992, "Magnetoresistance of multilayers", pp. 674–684).

The MMMS's at present having the largest number of requisite properties (significant magnetoresistive effect, low saturation field, low coercivity, good annealing resistance) are constituted by FeNi layers separated by copper layers and as described in document (2) by S. S. P. Parkin ("Oscillations in giant magnetoresistance and antiferromagnetic coupling in $[Ni_{81}Fe_{19}/Cu]_N$ N multilayers", Appl. Phys. Lett. 60, No. 4, January 1992, pp. 512–514) and document (3) by R. Nakatani et al. (IEEE Transactions on Magnetics, vol. 28, No. 5, September 1992, "Giant magnetoresistance in Ni—Fe/Cu multilayers formed by ion beam sputtering", pp. 2668–2670) or thin FeNi layers separated by silver layers, as described in document (4) by B. Rodmacq et al., (Journal of Magnetism and Magnetic materials 118, 1993, pp. L11–L16, "Magnetoresistive properties and thermal stability of Ni—Fe/Ag multilayers").

These new materials have the property of being highly magnetoresistive, i.e. having a ratio $\Delta\rho/\rho$ from 10 to 20, whilst having weak magnetic saturation fields, i.e. below 40 kA/m.

In MMMS's the magnetoresistive effect corresponds to the rotation of the magnetizations of each of the magnetic layers, which are accompanied by a reduction in the electrical resistance during the application of an external magnetic field. In this case the saturation field Hs corresponds to the magnetic field which it is necessary to apply in order to orient in the same direction and sense, the magnetization of each of the different magnetic layers.

In the case of the ferromagnetic materials used in monolithic magnetoresistances, the resistance varies with the angle formed by the direction of the current density passing through the component and the magnetization direction in said material. The resistance is weakest when said angle is equal to $\pi/2$. It is therefore not of interest in this case to apply the magnetic field in any random direction, but perpendicular to the length of the magnetoresistive component. However, parallel to the length of the bar, there is no magnetoresistive effect within monolithic ferromagnetic materials.

In new MMMS's, the resistivity and therefore resistance variation is independent of the angle formed between the direction of the field present within the magnetoresistive component and the direction of the current flowing through it.

However, said field is equal to the difference between the demagnetizing field $H_d$ and the external magnetic field H applied. Bearing in mind the fact that the shape and size of the MMMS's are such that from a magnetic standpoint, said structures are generally anisotropic, the demagnetizing field is not identical in all directions in space. Thus, the sensitivity of the components varies with the direction of the magnetic field to be measured as soon as they have an anisotropy of form.

The invention is directed at a magnetoresistive component and at a transducer using said component optionally applicable to monolithic ferromagnetic materials and more particularly to metallic multilayer magnetic structures, having compared with the prior art components and transducers a reduction of the effects of the demagnetizing field and therefore an increase in sensitivity.

SUMMARY OF THE INVENTION

According to the invention, the magnetoresistive component has a multilayer-type magnetoresistive strip bent in accordance with a repeated geometrical pattern, so as to have at least one series of substantially parallel sections making it possible to reduce the demagnetizing field, the magnetoresistive strip being formed from a stack of magnetic metallic material layers separated by non-magnetic metallic material layers.

The strip arranged according to the invention consequently gives the component both a high sensitivity when the field to be measured is applied thereto in the direction of the sections and consequently also a high directivity. Thus, each section can be likened to an "infinitely long" magnetoresistive bar.

Effectively, when a magnetic field to be measured is applied to the component substantially in the direction of the magnetoresistive strip sections, the demagnetizing field appearing in the material is particularly weak. Therefore the saturation field is equivalent to that of the "massive" material, i.e. having no anisotropy linked with the form or shape of the magnetic material.

Therefore the component is very sensitive to fields parallel to the sections. Conversely, when the field is applied perpendicular to the direction of the sections, the effect of the demagnetizing field is pronounced, which increases the saturation field and consequently reduces the sensitivity of the component.

Advantageously, the pattern can be in the form of a serpentine, sawtooth, Greek border or crenellation. A crenellated or indented pattern would appear to be a particularly interesting solution. Thus, the magnetoresistive strip has in this case a first series of sections aligned in a first direction and a second series of sections perpendicular to those of the first series. The length of the sections of each series, as well as their width would be adjusted so as to give the components the characteristics necessary for its application.

As a function of the envisaged application of the component and in particular in transducers for reading informations on magnetic supports or in directional transducers of the compass type, preference is given to the sensitivity and/or directivity of the component. Both the directivity and sensitivity of the component are a function of the pattern of the sections.

In the crenellated pattern, it is possible to introduce a large disproportion between the "parallel" and "perpendicular" sections and consider that there is only one series of sections. This series is the longest series of sections which, in the case of FIGS. 2, 3 and 4, are oriented perpendicular to the length of the component and which are the most sensitive. Moreover, the length of the sections is chosen greatly exceeding the width. This arrangement is more particularly appropriate for producing a directional transducer.

In a sawtooth pattern there are two series of sections respectively corresponding to the ramps on either side of each tooth.

The patterns of the magnetoresistive strip are preferably defined by a photolithography process making it possible to act on the different geometrical parameters with high accuracy and optimize the size and shape of the sections.

The magnetoresistive strip is produced in materials of the multilayer type constituted by a stack of magnetic metallic material layers and non-magnetic metallic material layers.

Preferably, the magnetic material is constituted by an alloy of iron, nickel and cobalt (FeNiCo) or an alloy of iron and nickel (FeNi). In addition, the non-magnetic material of the multilayer structures is advantageously copper or silver.

The invention also relates to a magnetoresistive transducer using the previously described magnetoresistive component, supported by a non-conductive substrate and having leads connected to the two ends of the magnetoresistive component.

The term non-conductive substrate is understood to mean a semiconductor or insulating substrate. This substrate can be of monocrystalline or polycrystalline silicon, gallium arsenide, glass, an organic material such as a polyimide (registered trademark Kapton) or even a metal covered with an electrical insulant.

When the substrate is semiconductive, an electrical insulant can optionally be provided between the magnetoresistive component and the substrate.

Advantageously, the transducer is covered with an electrically insulating material protective film having openings facing the ends of the strip in order to provide for the passage of the leads.

In certain cases, it may be preferable to associate a magnetic flux guide with the magnetoresistive component. The function of this guide is to detect the magnetic field lines in order to concentrate them and orient them in accordance with the most sensitive sections of the magnetoresistive strip. The use or not of said guide is dependent on the intensity of the magnetic fields to be read and the sensitivity of the materials constituting the magnetoresistive component.

Moreover, the shape of the flux guide is a function of the shape of the magnetoresistive strip. In all cases the shape of the guide must be such that it concentrates the magnetic field lines within the most sensitive sections.

In particular, the guide can have tongues suitable for guiding the field lines. The shape, spacing and, according to the particular case, the periodicity of the tongues are adapted so as to be appropriate for the shape of the magnetoresistive strip and for the arrangement of the most sensitive sections of said strip.

The use of a flux guide associated with a monolithic magnetoresistive component is more particularly described in documents (5) EP-A-445,883 and (6) EP-A-423,878.

The transducer according to the invention is more particularly intended for equipping a magnetic head for reading and/or writing magnetic informations on a magnetic track, such as a magnetic tape, hard disk, etc. In this case, the magnetoresistive component must have a total length equal to or smaller than the width of the magnetic track. The recording of the information can take place parallel or perpendicular to the track travel direction.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 2:
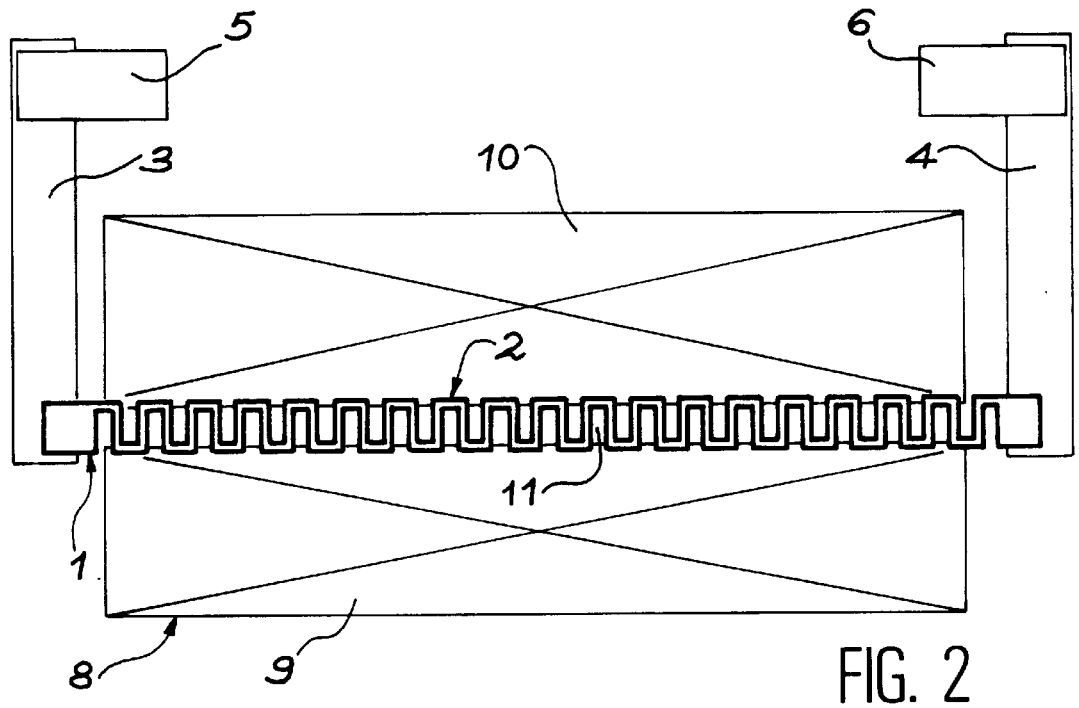
FIG. 2 diagrammatically and in plan view a magnetoresistive transducer according to the invention provided with a flux guide.

As illustrated in FIG. 2, the transducer has a multilayer magnetoresistive component 1 having a magnetoresistive strip 2 bent in accordance with a crenellated pattern with a similar configuration to certain Greek frets. The ends of the strip 2 are connected by current leads 3,4 to power points 5,6.

Figure 3:
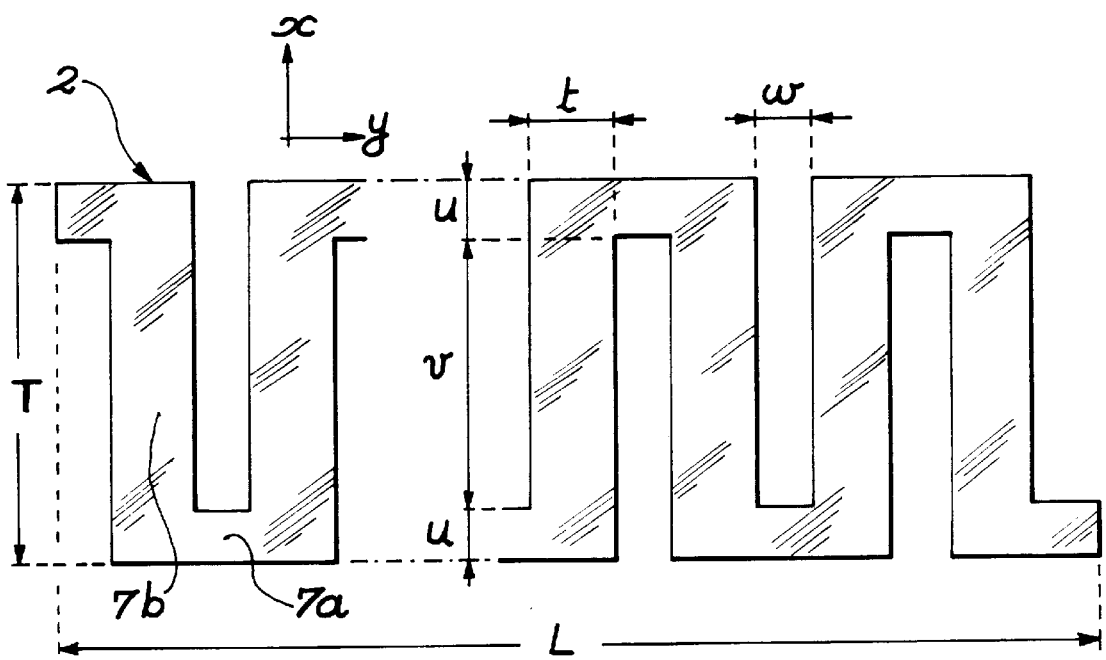
FIG. 3 diagrammatically and on a larger scale a detail of the magnetoresistive strip.

FIG. 3 is a detailed view of FIG. 2 and the sections of the strip 2 are parallel to a direction y in accordance with the length L of the component and carry the reference 7a and the main sections 7 parallel to the direction x perpendicular to y carry the reference 7b.

In addition, u,v,w,t and T designate respectively the width of the sections 7a, the length of the main sections 7b, the variation between two consecutive sections 7b, the width of the sections 7b and finally the width of the component. By adjusting these parameters, it is possible to modify the characteristics of the component.

In the case of the application of the transducer to a magnetic reading head, a magnetoresistive component according to the invention having a strip 2 bent in accordance with a crenellation of parameters u=2 $\mu$m, v=10 $\mu$m, t=2 $\mu$m, w=5 $\mu$m, T=14 $\mu$m, L=250 $\mu$m is suitable for the replacement of a conventional, 250 $\mu$m long, 14 $\mu$m wide magnetoresistive bar.

However, the saturation fields are highly attenuated by the particular shape of the strip, which tends to reduce the demagnetizing fields induced in the magnetoresistive material. Therefore the sensitivity $\alpha$ of the transducer can exceed that of the components of conventional transducers.

In addition, the shape of the strip 2 leads to an increase in the electrical resistance of the component 1 compared with a straight bar. This resistance increase makes it possible, for the same current, to have a much higher reading voltage.

In cases where a very considerable directivity of the transducer is required, e.g. in an application to a compass, the length v of the sections 7b of the magnetoresistive strip 2 is chosen so as to greatly exceed the width t.

For a crenellated or Greek border-like strip, the main sections 7b are long and thin and in practice the parameters are such that $0.2 \, \mu m \leq t \leq 5 \, \mu m$ and $v \geq 10 \, \mu m$.

The effect of the demagnetizing field is very great when the lines of the magnetic field to be detected are perpendicular to the main sections 7b of the strip 2 and negligible when these lines are directed in accordance with the sections. The saturation field is then that of the solid or massive material.

To further increase the sensitivity and directivity of the transducer, it can have a flux guide 8 with two portions 9 and 10 separated by a head gap 11 and positioned on either side of the magnetoresistive component 1 (FIG. 2). The flux guide 8 makes it possible to direct in preferred manner the magnetic field lines F (FIG. 4) to be detected towards the main sections 7b of the magnetoresistive strip.

Figure 1:
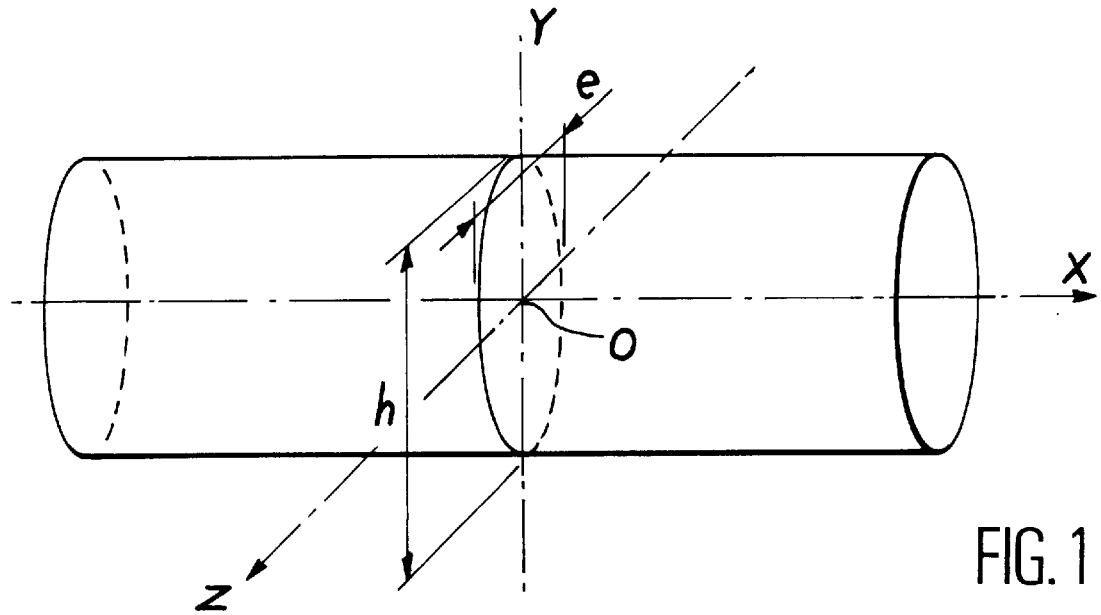
FIG. 1, already described, diagrammatically a magnetoresistive bar with an elliptical section permitting the illustration of the demagnetizing fields.
Figure 4:
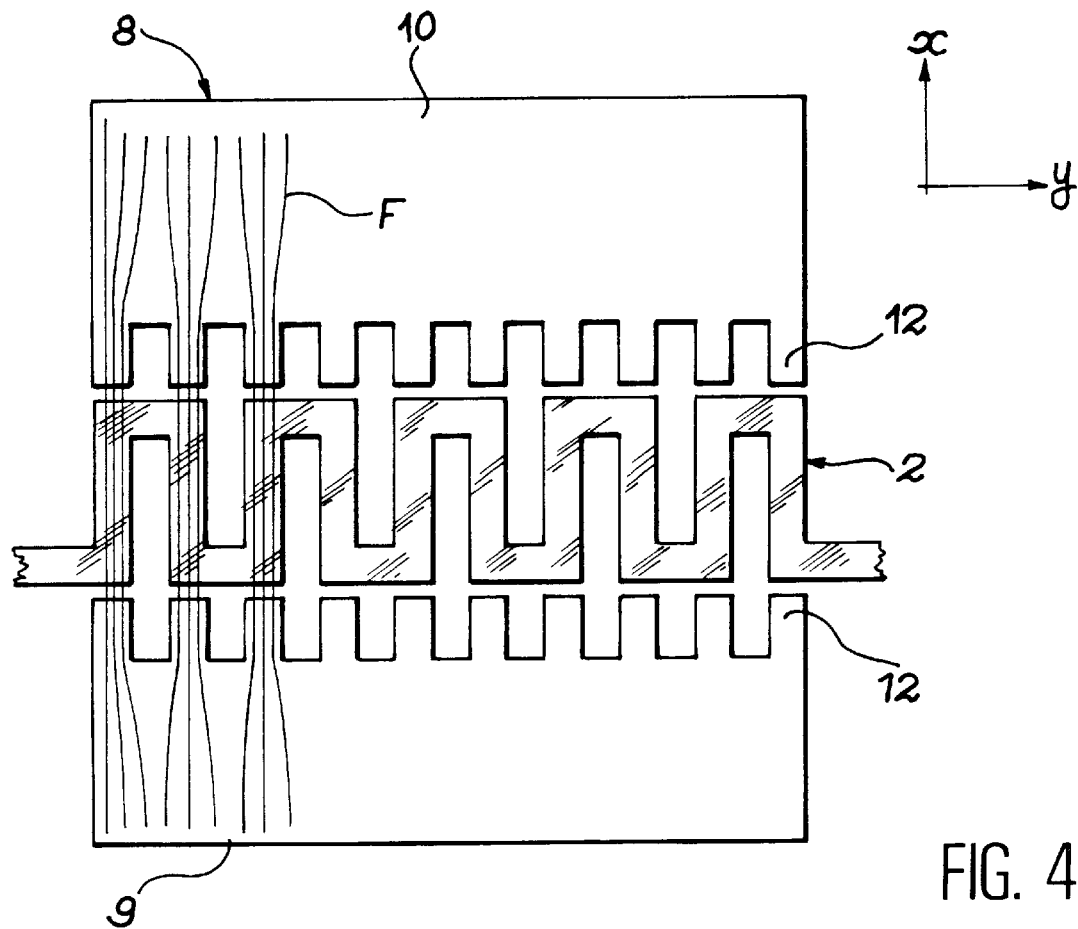
FIG. 4 diagrammatically and on a larger scale a detail of the flux guide and the magnetoresistive strip, illustrating the concentration of flux lines towards perpendicular sections of a magnetoresistive strip.

In a preferred embodiment illustrated in FIG. 4, the guide 8 has tongues 12 at the end of each of its portions 9,10 facing the head gap. The tongues 12 are positioned facing and in the alignment of the main sections 7b of the magnetoresistive strip 2, so as to directly concentrate the field lines F in said sections 7b.

The thus equipped transducer is highly directional and has a high electrical resistivity, which authorizes measurements with small current densities which can be below or close to 1 mA.

Figure 5:
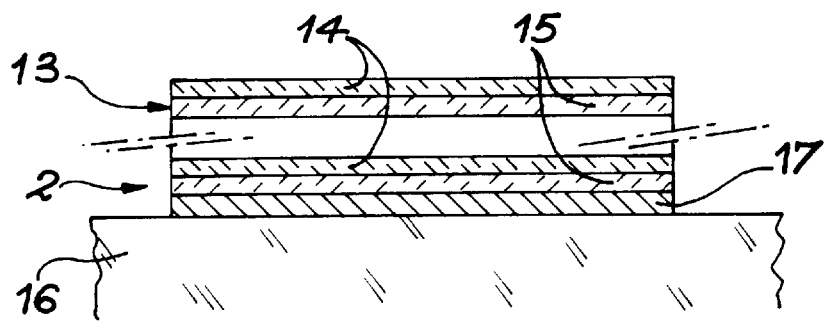
FIG. 5 a diagrammatic sectional view of a detail of a multilayer magnetoresistive strip deposited on a substrate.

Preferably and as shown in FIG. 5, the magnetoresistive strip 2 is formed by a stack 13 of thin magnetic layers 14 separated by thin metallic non-magnetic layers 15. In exemplified manner, said magnetic layers 14 are of an iron and nickel alloy and the metallic layers are of copper or silver. The strip will e.g. comprise 40 iron and nickel alloy layers with a thickness of 1.2 nm and 40 silver layers with a thickness of 1.1 nm.

The strip 2 is deposited on a semiconductor or insulating substrate 16 which can be of glass, silicon or Kapton. The prior deposition on said substrate 16 of a thin metallic layer 17 of iron or copper makes it possible in certain MMMS's to improve the crystalline quality of the multilayer structure and therefore improve the magnetoresistive properties.

As illustrated in FIG. 6A, the production of the magnetoresistive component firstly comprises the deposition of the magnetoresistive strip 2 on the substrate 16. This operation involves the deposition of a multilayer magnetoresistive film and optionally the deposition of the thin metal layer 17 beforehand, which are then etched by ionic machining. For this purpose, use is made of a mask and photolithographic processes.

The deposition of the thin layers or films can be carried out by cathodic sputtering or vacuum evaporation or molecular beam epitaxy with regards to the multilayer magnetoresistive strip.

Figure 6E:
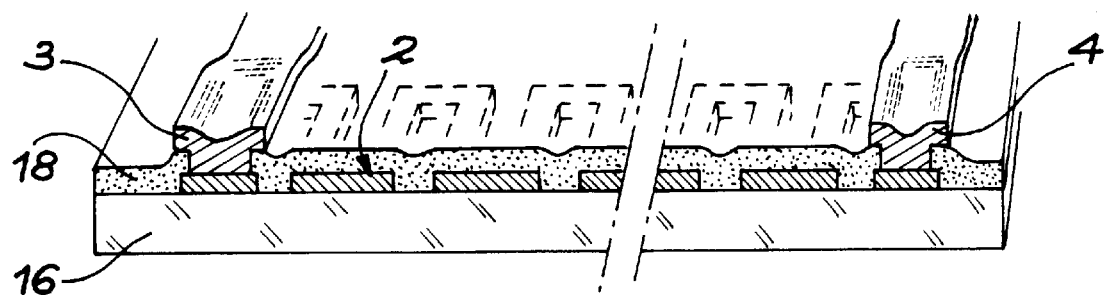
FIGS. 6A to 6F diagrammatically and in longitudinal sections the different stages of producing a magnetoresistive component according to the invention.

In a second stage (FIG. 6B), an electrical and magnetic insulant 18 such as silica is deposited. Then, openings 19,20 (as shown in FIG. 6C) are made in the insulant 18 so as to make contacts on the magnetoresistive strip 2. Finally, a conductive material 21, e.g. tungsten, is deposited (FIG. 6D) and then etched (FIG. 6E) to form the leads 3,4. Etching is carried out chemically or by ionic machining.

Figure 6F:
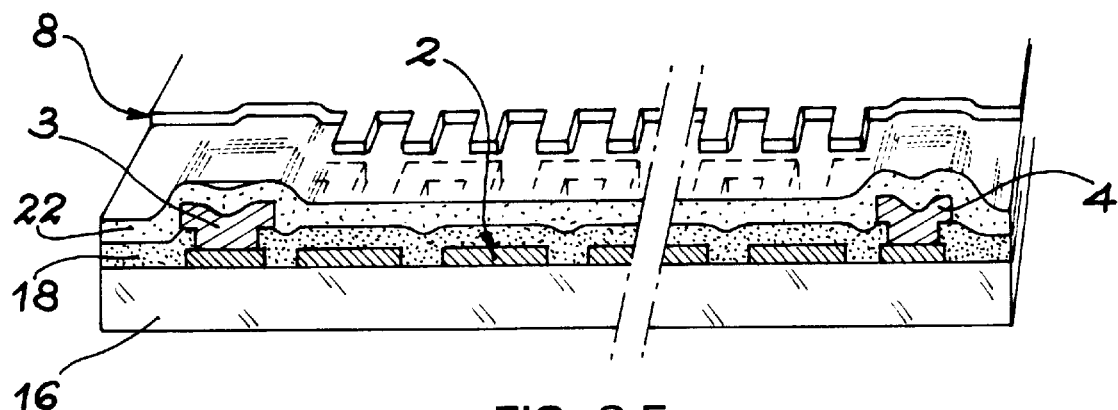

In order to produce directly the magnetoresistive transducer, a supplementary silica layer 22 (FIG. 6F) is deposited for insulating the leads 3,4 and then optionally a soft magnetic material in thin film form. The latter is etched in order to form the flux guide 8. In FIG. 6F, only part of the flux guide 8 is shown. For the said guide, iron and nickel or iron, aluminium and silicon alloys are used.

In addition, not shown contacts are produced on the leads 3,4 so as to be able to connect the transducer to an electronic circuit.

Figure 6:
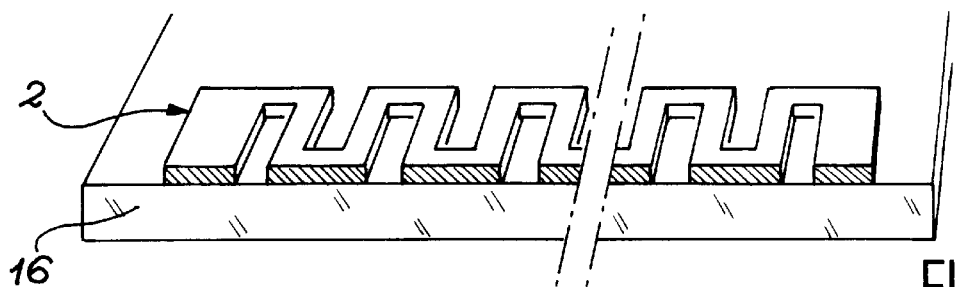
Figure 6:
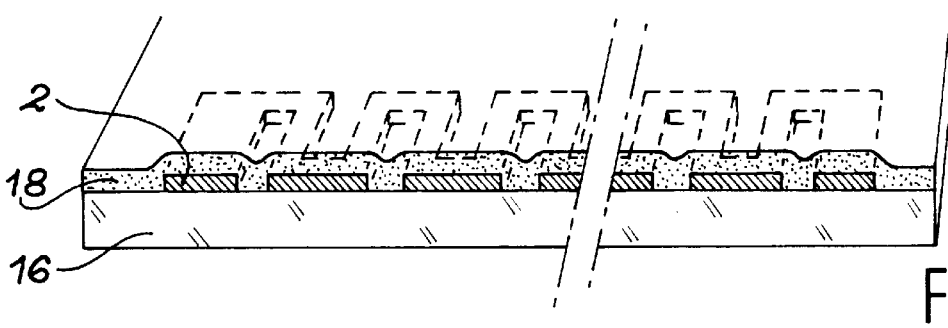
Figure 6:
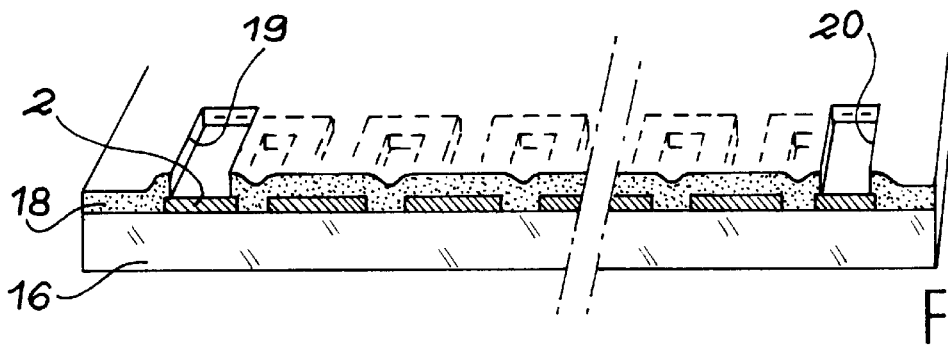
Figure 6:
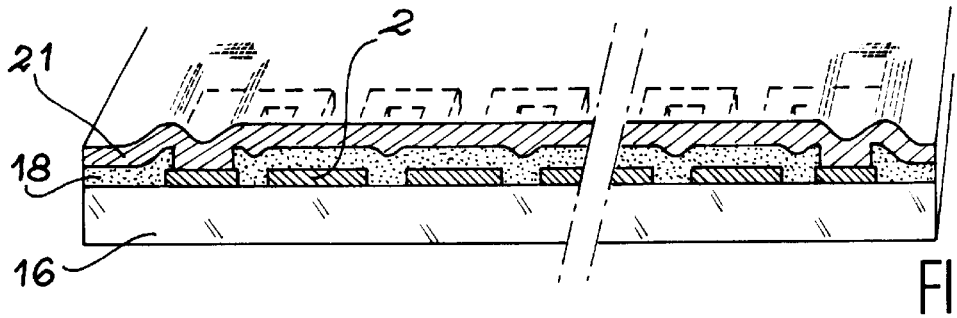

In FIG. 6 the guide is produced after the magnetoresistive strip, but can also be produced before said strip (cf. FIG. 2).

Figure 7:
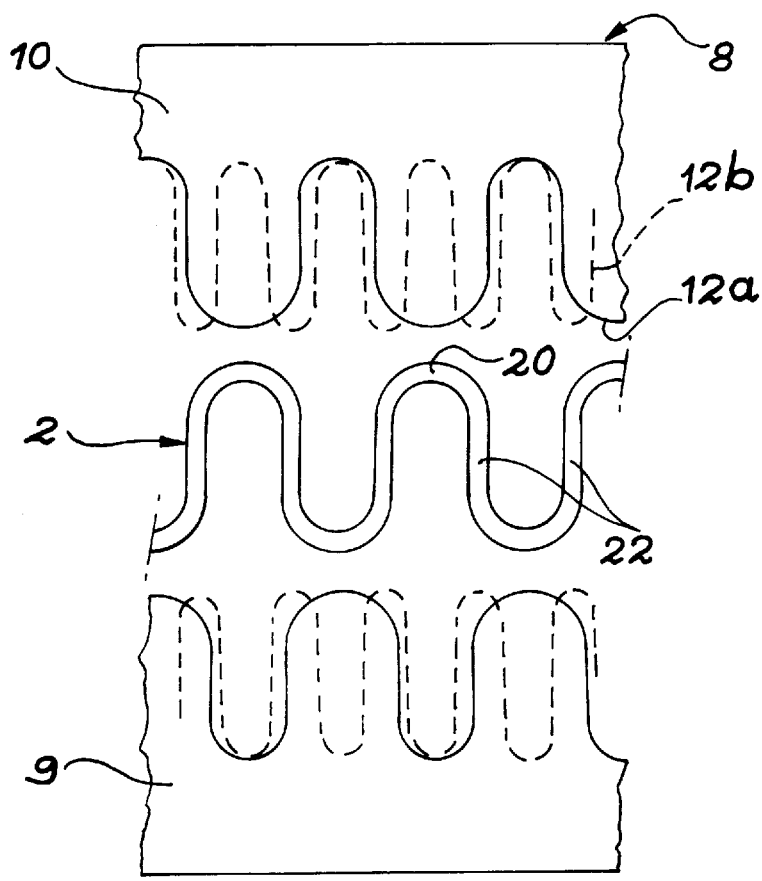
FIGS. 7 and 8 possible shape variants for the magnetoresistive strip and flux guide.
Figure 8:
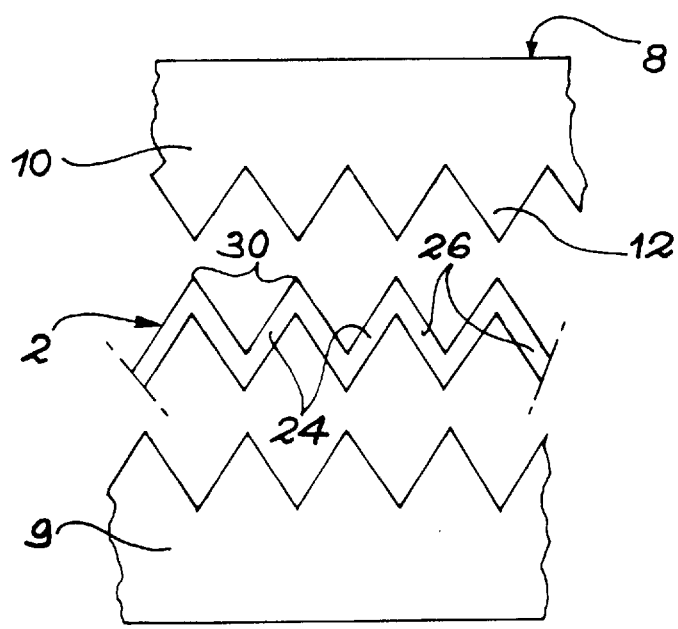

Finally, FIGS. 7 and 8 show shape alternatives for producing the magnetoresistive strip and the associated flux guides.

FIG. 7 shows a serpentine-shaped magnetoresistive strip 2 having a succession of curved portions 20 and sections 22 perpendicular to the length of the component. The associated flux guide also has a serpentine shape, which can e.g. have and as shown in thick line form tongues 12, whose width corresponds essentially to that of each corresponding curved portion 20 of the strip. Thus, there is one tongue 12 for two consecutive sections 22. The tongues 12, as shown in broken line form, can be thinner and closer together by being positioned in front of each section 22 of the strip 2.

In both cases the tongues 12 direct the not shown flux lines along the most sensitive sections 22 perpendicular to the length of the component.

The flux guide shown in FIG. 8 has sawtooth-shaped tongues for directing the not shown lines of the field to be measured along the sections 24 and 26 of the magnetoresistive strip 2 also bent in sawtooth form. Moreover, as shown in the drawing, the ends of the tongues 12 are positioned facing tips 30 formed at each intersection of two sections 24,26 of the magnetoresistive strip.

The tongues 12, 12a, 12b of the flux guide 8 can be positioned in facing manner and set back with respect to the sections of the strip 2, as can be seen in FIGS. 7 and 8. According to a constructional variant of the transducer, the tongues 12, 12a can also partly overlap the magnetoresistive strip.

Figure 9:
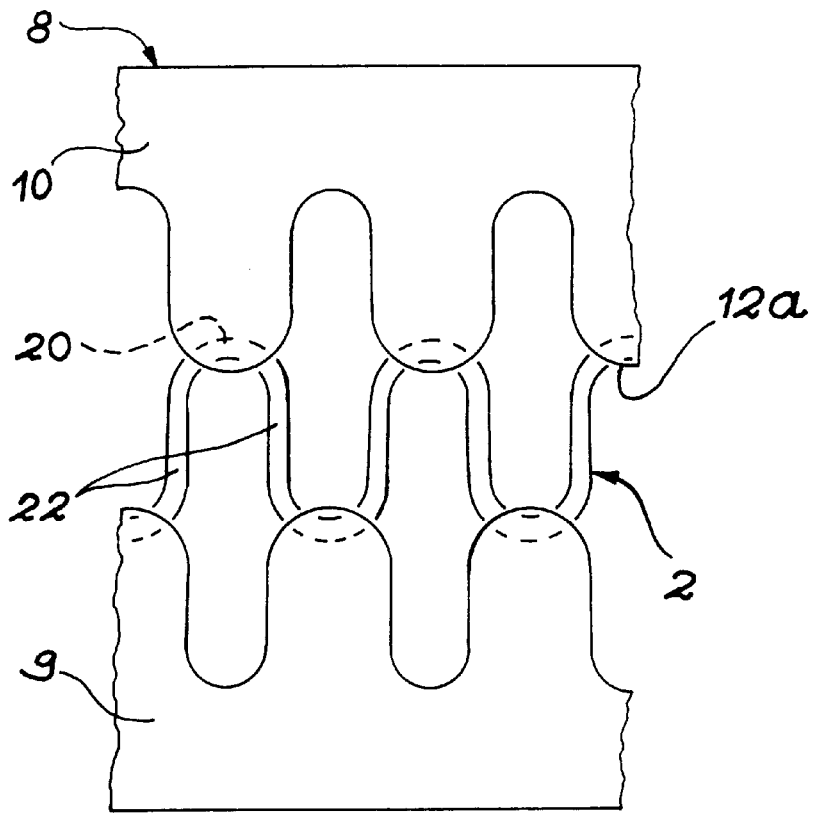
FIGS. 9 and 10 respectively corresponding to FIGS. 7 and 8 and showing a flux guide arrangement variant.
Figure 10:
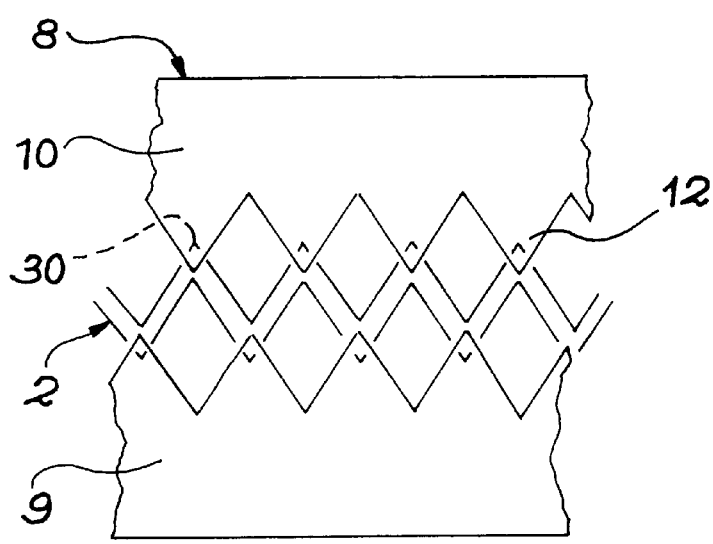

As shown in FIGS. 9 and 10 which, except for the positioning of the portions 9,10 of the flux guide with respect to the strip, are identical to FIGS. 7 and 8, the ends of the tongues 12, 12a respectively overlap the tips 30 and the curved portions 20 of the strip 2.

We claim:

1. Magnetoresistive transducer for measuring a magnetic field, the magnetoresistive transducer comprising a magnetoresistive component (1) comprising a multilayer-type magnetoresistive strip (2) bent in accordance with a repeating geometrical pattern (7a, 7b), the pattern having a series of substantially parallel sections (7a, 7b) for reducing demagnetizing fields, the magnetoresistive strip (2) being of a metallic multilayer magnetic structure and formed from a stack (13) of layers (14) of a magnetic metallic material separated by layers (15) of an electrically conductive, non-magnetic metallic material wherein said magnetic metallic layers are coupled by an antiferromagnetic coupling; the magnetoresistive component (1) is supported by a non-conductive substrate (12) and has power points (5,6) connected to the magnetoresistive component (1) by leads (3,4); a width (t) of the sections (7b) of the series is smaller than a length (v) of said sections; and the length (v) of said sections (7b) is $\geq 10$ $\mu$m and the width (t) of said sections is such that $0.2$ $\mu$m$\leq$t$\leq 5$ $\mu$m.

2. Magnetoresistive transducer for measuring a magnetic field, the magnetoresistive transducer comprising a magnetoresistive component (1) comprising a multilayer-type magnetoresistive strip (2) bent in accordance with a repeating geometrical pattern (7a, 7b), the pattern having a series of substantially parallel sections (7a, 7b) for reducing demagnetizing fields, the magnetoresistive strip (2) being of a metallic multilayer magnetic structure and formed from a stack (13) of layers (14) of a magnetic metallic material separated by layers (15) of an electrically conductive, non-magnetic metallic material wherein said magnetic metallic layers are coupled by an antiferromagnetic coupling; the magnetoresistive component (1) is supported by a non-conductive substrate (12) and has power points (5,6) connected to the magnetoresistive component (1) by leads (3,4); and the repeating geometrical pattern of the magnetoresistive strip is a crenelated pattern and wherein the flux guide (8) has tongues (12) for directing the filed lines (F) along the sections (7b) and wherein the sections are perpendicular to a length (L) of the magnetoresistive component; and a flux guide (8) for orienting lines (F) of a magnetic field along said sections of the magnetoresistive strip.

3. Magnetoresistive transducer for measuring a magnetic field, the magnetoresistive transducer comprising a magnetoresistive component (1) comprising a multilayer-type magnetoresistive strip (2) bent in accordance with a repeating geometrical pattern (7a, 7b). the pattern having a series of substantially parallel sections (7a, 7b) for reducing demagnetizing fields, the magnetoresistive strip (2) being of a metallic multilayer magnetic structure and formed from a stack (13) of layers (14) of a magnetic metallic material separated by layers (15) of an electrically conductive, non-magnetic metallic material wherein said magnetic metallic layers are coupled by an antiferromagnetic coupling; the magnetoresistive component (1) is supported by a non-conductive substrate (12) and has power points (5,6) connected to the magnetoresistive component (1) by leads (3,4); and the repeating geometrical pattern of the magnetoresistive strip is a serpentine pattern further having a succession of curved portions (20) and wherein the sections (22) are perpendicular to a length of the magnetoresistive component and wherein the flux guide has tongues (12) for directing the field lines along the sections (22); and a flux guide (8) for orienting lines (F) of a magnetic field along said sections of the magnetoresistive strip.

4. Magnetoresistive transducer for measuring a magnetic field, the magnetoresistive transducer comprising a magnetoresistive component (1) component comprising a multilayer-type magnetoresistive strip (2) bent in accordance with a repeating geometrical pattern (7a, 7b), the pattern having a series of substantially parallel sections (7a, 7b) for reducing demagnetizing fields, the magnetoresistive strip (2) being of a metallic multilayer magnetic structure and formed from a stack (13) of layers (14) of a magnetic metallic material separated by layers (15) of an electrically conductive, non-magnetic metallic material wherein said magnetic metallic layers are coupled by an antiferromagnetic coupling wherein the magnetoresistive component (1) is supported by a non-conductive substrate (12) an has power points (5,6) connected to the magnetoresistive component (1) by leads (3,4); and the repeating geometrical pattern of the magnetoresistive strip is a sawtooth pattern further having a succession of segments and wherein the flux guide has tongues (12) for directing the field lines along the segments and the sections; and a flux guide (8) for orienting lines (F) of a magnetic field along said sections of the magnetoresistive strip.

* * * * *